United States Patent
Hara

(10) Patent No.: US 10,514,617 B2
(45) Date of Patent: Dec. 24, 2019

(54) EXPOSURE APPARATUS, MANUFACTURING METHOD OF FLAT-PANEL DISPLAY, DEVICE MANUFACTURING METHOD, AND EXPOSURE METHOD

(71) Applicant: NIKON CORPORATION, Tokyo (JP)

(72) Inventor: Atsushi Hara, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/763,814

(22) PCT Filed: Sep. 29, 2016

(86) PCT No.: PCT/JP2016/078838
§ 371 (c)(1),
(2) Date: Aug. 9, 2018

(87) PCT Pub. No.: WO2017/057583
PCT Pub. Date: Apr. 6, 2017

(65) Prior Publication Data
US 2018/0348652 A1 Dec. 6, 2018

(30) Foreign Application Priority Data
Sep. 30, 2015 (JP) ................................ 2015-193726

(51) Int. Cl.
*G03F 7/20* (2006.01)
*G02F 1/13* (2006.01)

(52) U.S. Cl.
CPC ........ *G03F 7/70775* (2013.01); *G02F 1/1303* (2013.01)

(58) Field of Classification Search
CPC ...... G02F 1/1303; G03F 7/20; G03F 7/70775; H01L 21/68
See application file for complete search history.

(56) References Cited

U.S. PATENT DOCUMENTS

| | | | |
|---|---|---|---|
| 5,729,331 A | 3/1998 | Tanaka et al. | |
| 6,552,775 B1 | 4/2003 | Yanagihara et al. | |
| 6,639,686 B1 | 10/2003 | Ohara | |
| 9,726,985 B2 * | 8/2017 | Van De Ven | ....... G03F 7/70758 |

(Continued)

OTHER PUBLICATIONS

Dec. 27, 2016 Written Opinion issued in International Patent Application No. PCT/JP2016/078838.

(Continued)

*Primary Examiner* — Deoram Persaud
(74) *Attorney, Agent, or Firm* — Oliff PLC

(57) ABSTRACT

A liquid crystal exposure apparatus is equipped with: a substrate holder that is disposed below a projection optical system and holds a substrate; a first drive section that moves the substrate holder along an XY plane; heads that measures the position information of the substrate holder; head stages that support the heads and are movable within the XY plane; and a second drive section that moves the head stages in the X-axis direction and the Y-axis direction, and the second drive section moves the head stages in the X-axis direction or the Y-axis direction when the substrate holder is moved in the X-axis direction or the Y-axis direction by the first drive section.

14 Claims, 10 Drawing Sheets

(56) References Cited

U.S. PATENT DOCUMENTS

| | | | |
|---|---|---|---|
| 2007/0076218 A1* | 4/2007 | Van Empel | G03F 7/70891 356/509 |
| 2007/0288121 A1* | 12/2007 | Shibazaki | G03F 7/70516 700/213 |
| 2008/0030702 A1 | 2/2008 | Kawamura | |
| 2008/0094592 A1 | 4/2008 | Shibazaki | |
| 2008/0100819 A1* | 5/2008 | Onvlee | G03F 7/707 355/75 |
| 2008/0129762 A1 | 6/2008 | Shiomi | |
| 2010/0018950 A1 | 1/2010 | Aoki et al. | |
| 2010/0073652 A1* | 3/2010 | Shibazaki | G03F 7/707 355/53 |
| 2010/0157263 A1* | 6/2010 | Van Eijk | G03B 27/42 355/53 |
| 2010/0266961 A1 | 10/2010 | Kawamura et al. | |
| 2011/0085180 A1* | 4/2011 | Beerens | G03F 7/70766 356/614 |
| 2012/0057140 A1 | 3/2012 | Aoki | |
| 2014/0307246 A1* | 10/2014 | Schuster | G03F 7/70783 355/72 |
| 2015/0212425 A1* | 7/2015 | Chieda | G03F 7/70783 355/52 |
| 2017/0108716 A1* | 4/2017 | Shirato | G02F 1/1303 |
| 2018/0275533 A1* | 9/2018 | Shirato | G03F 7/70775 |
| 2018/0284619 A1* | 10/2018 | Shirato | G03F 7/70775 |
| 2018/0341183 A1* | 11/2018 | Shimoyama | G02F 1/1303 |
| 2018/0356739 A1* | 12/2018 | Aoki | G03F 7/70791 |
| 2018/0364595 A1* | 12/2018 | Shirato | G01D 5/00 |

OTHER PUBLICATIONS

Dec. 27, 2016 International Search Report issued in International Patent Application No. PCT/JP2016/078838.

* cited by examiner

EXPOSURE APPARATUS, MANUFACTURING METHOD OF FLAT-PANEL DISPLAY, DEVICE MANUFACTURING METHOD, AND EXPOSURE METHOD

TECHNICAL FIELD

The present invention relates to exposure apparatuses, manufacturing methods of flat-panel displays, device manufacturing methods and exposure methods, and more particularly to an exposure apparatus and an exposure method to expose an object with an illumination light, and a manufacturing method of flat-panel displays or a device manufacturing method using the exposure apparatus.

BACKGROUND ART

Conventionally, in a lithography process for manufacturing electronic devices (microdevices) such as liquid crystal display devices and semiconductor devices (integrated circuits and the like), used are exposure apparatuses such as an exposure apparatus of a step-and-scan method (a so-called scanning stepper (which is also called a scanner)) that, while synchronously moving a mask (a photomask) or a reticle (hereinafter, generically referred to as a "mask") and a glass plate or a wafer (hereinafter, generically referred to as a "substrate") along a predetermined scanning direction (scan direction), transfers a pattern formed on the mask onto the substrate using an energy beam.

As this type of exposure apparatuses, such an exposure apparatus is known that is equipped with an optical interferometer system that obtains the position information of a substrate serving as an exposure target, within a horizontal plane, using a bar mirror (a long mirror) that a substrate stage device has (e.g., refer to PTL 1).

Here, in the case of obtaining the position information of a substrate using the optical interferometer system, the influence of so-called air fluctuation cannot be ignored. Further, although the influence of air fluctuation can be reduced by using an encoder system, it is difficult to prepare a scale that can cover the entire movement range of the substrate due to the increase in size of the substrate in recent years.

CITATION LIST

Patent Literature

[PTL 1] U.S. Patent Application Publication No. 2010/0266961

SUMMARY OF INVENTION

According to a first aspect of the present invention, there is provided an exposure apparatus that exposes an object with an illumination light via a projection optical system, the apparatus comprising: a first movable body that is disposed below the projection optical system, and holds the object; a first drive section that moves the first movable body in a first direction and a second direction that are orthogonal to each other within a predetermined plane orthogonal to an optical axis of the projection optical system; a measurement section that measures position information of the first movable body; and a second movable body that supports the measurement section and is movable within the predetermined plane; and a second drive section that moves the second movable body in the first and the second directions, wherein the second drive section moves the second movable body in the first direction or the second direction when the first movable body is moved in the first direction or the second direction by the first drive section.

According to a second aspect of the present invention, there is provided a manufacturing method of a flat-panel display, comprising: exposing the object using the exposure apparatus related to the first aspect; and developing the object that has been exposed.

According to a third aspect of the present invention, there is provided a device manufacturing method, comprising: exposing the object using the exposure apparatus related to the first aspect; and developing the object that has been exposed.

According to a fourth aspect of the present invention, there is provided an exposure method of exposing an object with an illumination light via a projection optical system, the method comprising: moving a first movable body in a first direction and a second direction by a first drive section, the first movable body being disposed below the projection optical system and holding the object, and the first and the second direction being orthogonal to each other within a predetermined plane orthogonal to an optical axis of the projection optical system; measuring position information of the first movable body by a measurement section; moving a second movable body in the first and the second directions by a second drive section, the second movable body supporting the measurement section and being movable within the predetermined plane; and moving the second movable body in the first direction or the second direction by the second drive section when the first movable body is moved in the first direction or the second direction by the first drive section.

DESCRIPTION OF EMBODIMENTS

First Embodiment

A first embodiment will be described below, using FIGS. 1 to 7.

Figure 1:
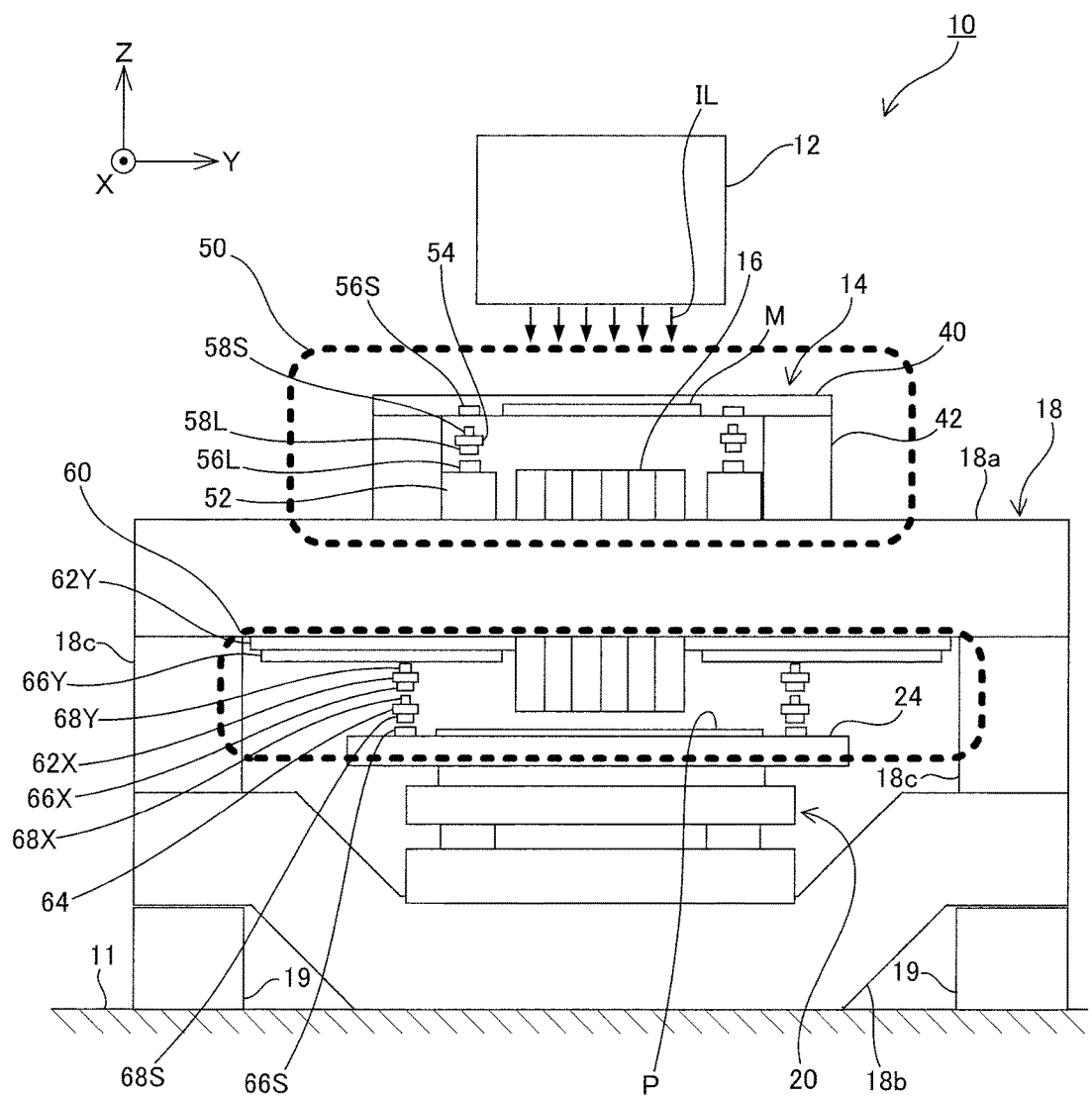
FIG. 1 is a view schematically showing the configuration of a liquid crystal exposure apparatus related to a first embodiment.

FIG. 1 schematically shows the configuration of a liquid crystal exposure apparatus 10 related to the first embodiment. Liquid crystal exposure apparatus 10 is a projection exposure apparatus of a step-and-scan method, which is a so-called scanner, with a rectangular (square) glass substrate P (hereinafter, simply referred to as a substrate P) used in, for example, a liquid crystal display device (a flat-panel display) or the like, serving as an object to be exposed.

Liquid crystal exposure apparatus 10 has: an illumination system 12; a mask stage device 14 to hold a mask M on which a circuit pattern and the like are formed; a projection optical system 16; an apparatus main body 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 at the time of exposure is an X-axis direction, a direction orthogonal to the X-axis within a horizontal plane is a Y-axis direction, and a direction orthogonal to the X-axis and the Y-axis is a Z-axis direction, and rotation directions around the X-axis, the Y-axis and the Z-axis are a θx direction, a θy direction and a θz direction, respectively. Further, the explanation is given assuming that the positions in the X-axis direction, the Y-axis direction and the Z-axis direction are an X-position, a Y-position and a Z-position, respectively.

Illumination system 12 is configured similarly to an illumination system disclosed in, for example, U.S. Pat. No. 5,729,331 and the like. Illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, light such as, for example, an i-line (with a wavelength of 365 nm), a g-line (with a wavelength of 436 nm), and an h-line (with a wavelength of 405 nm) (or synthetic light of the i-line, the g-line and the h-line described above) is used.

Mask stage device 14 includes: a mask holder 40 that holds mask M by, for example, vacuum adsorption; a mask driving system 48 (not illustrated in FIG. 1, see FIG. 6) for driving mask holder 40 with a predetermined long stroke in the scanning direction (the X-axis direction), and also finely driving mask holder 40 in the Y-axis direction and the θz direction as needed; and a mask encoder system 50 for obtaining the position information within the XY plane (including also rotation amount information in the θz direction, the same applying hereinafter) of mask holder 40. Mask holder 40 is made up of a frame-like member in which an opening section with a rectangular shape in planar view is formed, as disclosed in, for example, U.S. Patent Application Publication No. 2008/0030702. Mask holder 40 is placed, for example, via air bearings (not illustrated), on a pair of mask guides 42 fixed to an upper mount section 18a that is a part of apparatus main body 18. Mask driving system 48 includes, for example, a linear motor (not illustrated). The configuration of mask encoder system 50 will be described in detail later.

Projection optical system 16 is disposed below mask stage device 14. Projection optical system 16 is a so-called multi-lens type projection optical system having a configuration similar to a projection optical system disclosed in, for example, U.S. Pat. No. 6,552,775 and the like, and projection optical system 16 is equipped with a plurality (e.g. eleven in the present embodiment, see FIG. 3A) of optical systems that are, for example, both-side telecentric unmagnification systems, and form erected normal images.

In liquid crystal exposure apparatus 10, when an illumination area on mask M is illuminated with illumination light IL from illumination system 12, by the illumination light that has passed through mask M, a projected image (a partial erected image) of a circuit pattern of mask M within the illumination area is formed, via projection optical system 16, on an irradiation area (an exposure area) of the illumination light, on substrate P, that is conjugate with the illumination area. Then, mask M is moved relative to the illumination area (illumination light IL) in the scanning direction and also substrate P is moved relative to the exposure area (illumination light IL) in the scanning direction, and thereby the scanning exposure of one shot area on substrate P is performed and the pattern formed on mask M is transferred onto the shot area.

Apparatus main body 18 supports mask stage device 14 and projection optical system 16 described above, and is installed on a floor 11 of a clean room via a plurality of vibration isolating devices 19. Apparatus main body 18 is configured similarly to an apparatus main body as disclosed in, for example, U.S. Patent Application Publication No. 2008/0030702, and apparatus main body 18 has: upper mount section 18a, a lower mount section 18b and a pair of middle mount sections 18c. Since projection optical system 16 described above is supported by upper mount section 18a, hereinafter the explanation is given referring to upper mount section 18a as an "optical surface plate 18a" as needed.

Substrate stage device 20 is a device for performing the high accuracy positioning of substrate P relative to projection optical system 16 (illumination light IL), and substrate stage device 20 drives substrate P with a predetermined long stroke along the horizontal plane (the X-axis direction and the Y-axis direction), and also finely drives substrate P in directions of six degrees of freedom. Although the configuration of substrate stage device 20 is not particularly limited, it is preferable to use a stage device having a so-called coarse-fine movement configuration that includes a gantry type two-dimensional coarse movement stage and a fine movement stage that is finely driven relative to the two-dimensional coarse movement stage, as disclosed in, for example, U.S. Patent Application Publication No. 2008/0129762 or U.S. Patent Application Publication No. 2012/0057140, and the like.

Substrata stage device 20 is equipped with a substrate holder 24. Substrate holder 24 is made up of a plate-like member with a rectangular shape in planar view, and substrate P is placed on the upper surface of substrate holder 24. Substrate holder 24 is driven with a predetermined long stroke relative to projection optical system 16 in the X-axis direction and/or the Y-axis direction and also finely driven in the directions of six degrees of freedom, by a plurality of linear motors (e.g. voice coil motors) that configure a part of substrate driving system 28 (not illustrated in FIG. 1, see FIG. 6).

Figure 6:
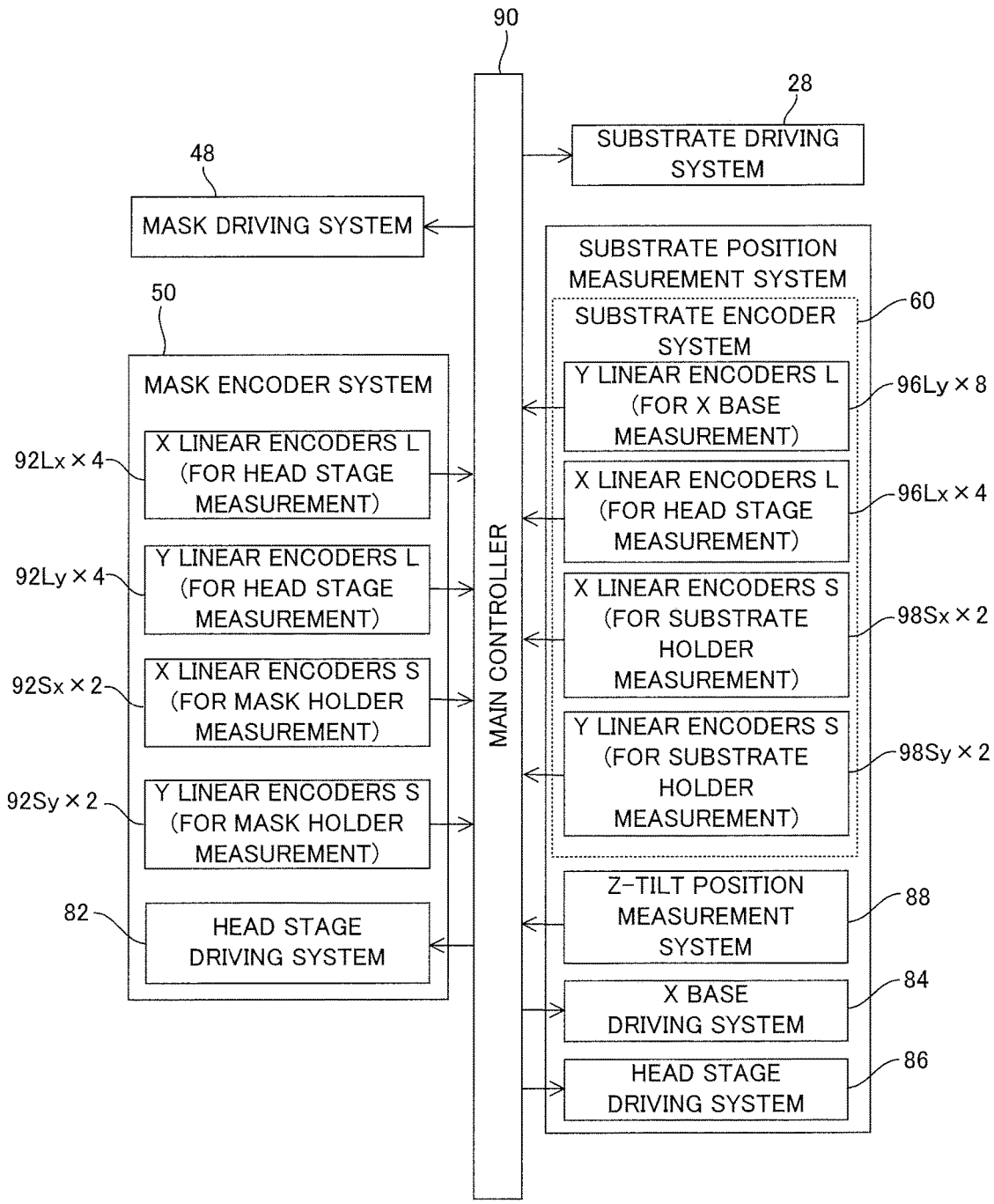
FIG. 6 is a block diagram showing the input/output relationship of a main controller that centrally configures a control system of the liquid crystal exposure apparatus.

Further, liquid crystal exposure apparatus 10 has a substrate position measurement system for obtaining the position information of substrate holder 24 (i.e. substrate P) in the directions of six degrees of freedom. As illustrated in FIG. 6, the substrate position measurement system includes a Z-tilt position measurement system 88 for obtaining the position information of substrate P in the Z-axis direction, the θx direction and the θy direction (hereinafter, referred to as Z-tilt directions), and a substrate encoder system 60 for obtaining the position information of substrate P within the XY plane. Although the configuration of Z-tilt position measurement system 88 is not particularly limited, such a measurement system can be used that obtains the position information of substrate P in the Z-tilt directions with apparatus main body 18 (e.g. lower mount section 18b) serving as a reference, using a plurality of sensors attached to a system including substrate holder 24, as disclosed in, for example, U.S. Patent Application Publication No. 2010/0018950. The configuration of substrate encoder system 60 will be described later.

Figure 2:
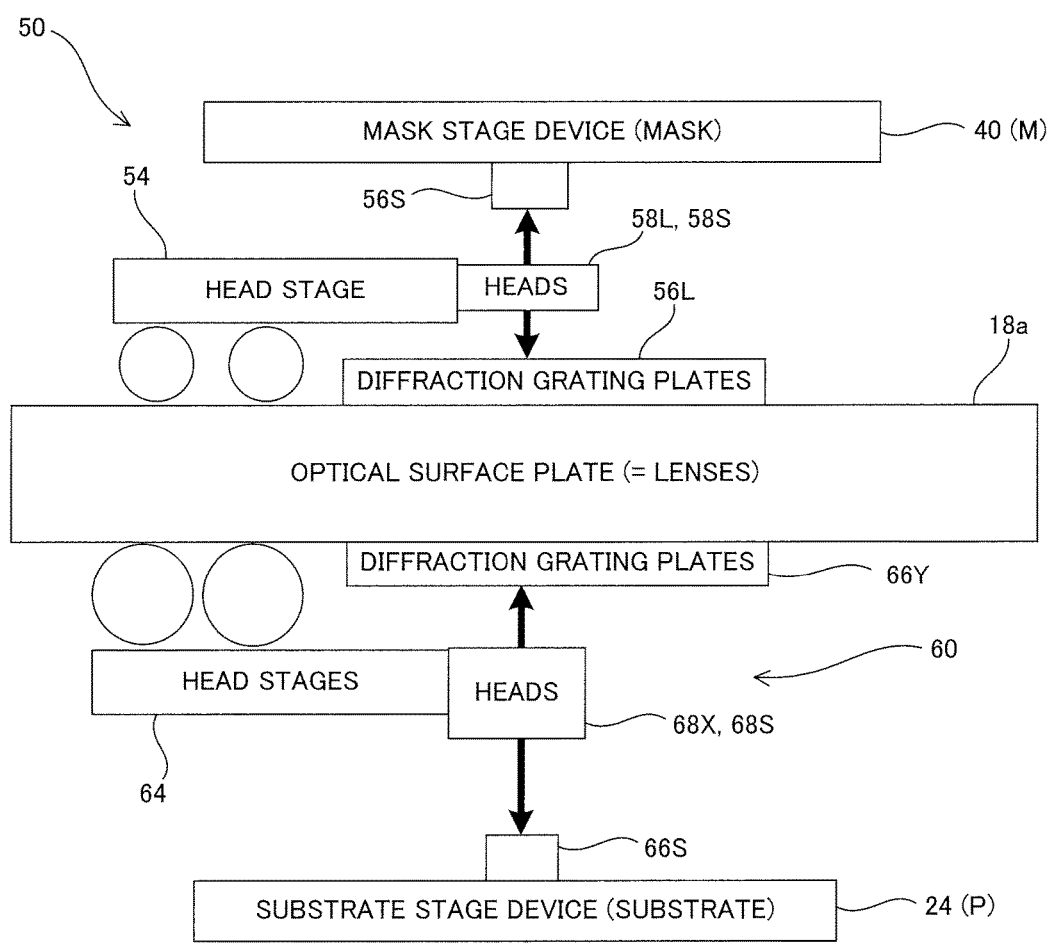
FIG. 2 is a concept view of a mask encoder system and a substrate encoder system equipped in the liquid crystal exposure apparatus shown in FIG. 1.

Next, the concept of mask encoder system 50 and substrate encoder system 60 in the present embodiment will be described using FIG. 2. As shown in FIG. 2, mask encoder system 50 obtains the position information of mask holder 40 with optical surface plate 18a (projection lenses) serving as a reference. Also, substrate encoder system 60 obtains the position information of substrate P with optical surface plate 18a (projection lenses) serving as a reference.

Mask encoder system 50 has a head stage 54 to which a plurality of encoder heads (hereinafter, simply referred to as "heads") 58L and 58S are attached. Head stage 54 is movable with a long stroke relative to optical surface plate 18a in the X-axis direction, synchronously with the movement of mask stage device 14 holding mask M. The position information of head stage 54 is obtained by a long encoder system that includes head 58L referred to above and an encoder scale 56L (hereinafter, referred to as a long scale 56L (a diffraction grating plate)) fixed to optical surface plate 18a. Further, the relative position information between head stage 54 and mask holder 40 is obtained by a short encoder system that includes head 58S referred to above and an encoder scale 56S (hereinafter, referred to a short scale 56S (a diffraction grating plate)) fixed to mask holder 40. Mask encoder system 50 obtains the position information of mask holder 40 with optical surface plate 18a serving as a reference, on the basis of the output of the long encoder system referred to above and the output of the short encoder system referred to above. Note that the length of long scale 56L in the X-axis direction is longer than the length of short scale 56X in the X-axis direction. In other words, when comparing the length of long scale 56L in its longitudinal direction and the length of short scale 56S in its longitudinal direction, a scale whose length in the longitudinal direction is longer is referred to as long scale 56L and a scale whose length in the longitudinal direction is shorter is referred to as short scale 56S. Similarly, also in the substrate encoder system to be described later, the length of each of long scales 66X and 66Y in its longitudinal direction is longer than the length of a short scale 66S in its longitudinal direction.

Similarly, substrate encoder system 60 also has a head stage 64 to which a plurality of heads 68S and 68X are attached. Head stage 64 is movable with a long stroke relative to optical surface plate 18a in the X-axis direction and the Y-axis direction, synchronously with the movement of substrate stage 20 that moves substrate holder 24 on which substrate P is placed. The position information of head stage 64 is obtained by a long encoder system that includes head 68X referred to above, long scale 66Y (a diffraction grating plate) fixed to optical surface plate 18a, and the like. Further, the relative position information between head stage 64 and substrate holder 24 is obtained by a short encoder system that includes head 68S referred to above and short scale 66S (a diffraction grating plate) fixed to substrate holder 24. Substrate encoder system 60 obtains the position information of substrate holder 24 with optical surface plate 18a serving as a reference, on the basis of the output the long encoder system referred to above and the output of the short encoder system referred to above.

Next, a specific example of mask encoder system 50 will be described. As illustrated in FIG. 1, a pair of encoder bases 52 are fixed on the upper surface of optical surface plate 18a. Encoder base 52 is made up of a member extending in the X-axis direction. On the upper surface of each of the pair of encoder bases 52, a plurality of long scales 56L (overlapping in a depth direction of the page surface in FIG. 1, see FIG. 3A) are fixed. Further, on the lower surface of mask holder 40, a pair of short scales 56S are fixed, corresponding to the pair of encoder bases 52 described above. Further, a pair of head stages 54 are disposed between encoder bases 52 and mask holder 40, corresponding to the pair of encoder bases 52 described above.

Figure 3A:
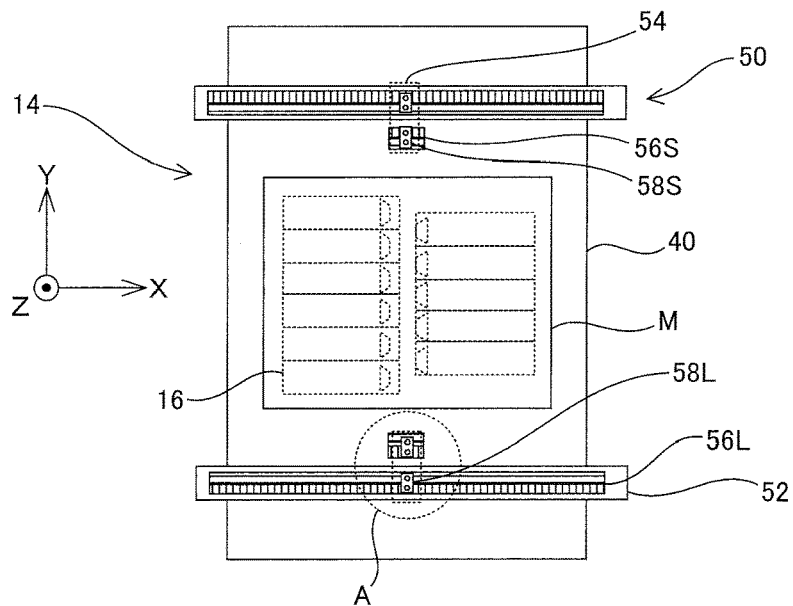
FIG. 3A is a plan view showing the configuration of the mask encoder system.
Figure 4A:
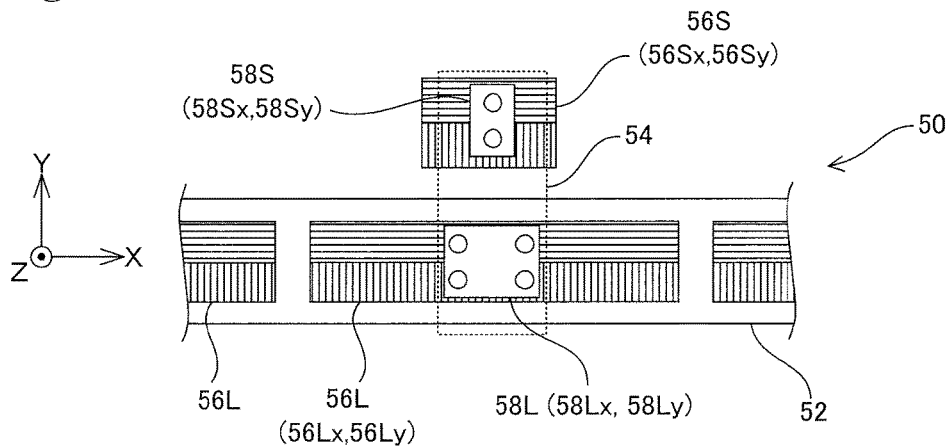
FIG. 4A is an enlarged view of an A-part of FIG. 3A.

As illustrated in FIG. 3A, a plurality of long scales 56L are fixed on the upper surface of encoder base 52. As illustrated in FIG. 4A, the plurality of long scales 56L are disposed at a predetermined spacing in the X-axis direction. Each of long scales 56L is made up of a plate-like (band-like) member that is formed of, for example, a quartz glass and has a rectangular shape in planar view extending in the X-axis direction. Encoder base 52 is formed of a material with a thermal expansion coefficient lower than (or equal to) that of long scale 56L so that the grating pitch is prevented from changing due to, for example, the change in temperature and the like.

An X scale 56Lx is formed in an area on one side (the Y side in FIG. 4A) in a width direction of long scale 56L, and a Y scale 56Ly is formed in an area on the other side (the +Y side in FIG. 4A) in the width direction. X scale 56Lx is configured of a reflective diffraction grating (an X grating) having a plurality of grid lines formed at a predetermined pitch in the X-axis direction (with the X-axis direction serving as a period direction) and extending in the Y-axis direction. Similarly, Y scale 56Ly is configured of a reflective diffraction grating (a Y grating) having a plurality of grid lines formed at a predetermined pitch in the Y-axis direction (with the Y-axis direction serving as a period direction) and extending in the X-axis direction. In X scale 56Lx and Y scale 56Ly of the present embodiment, the plurality of grid lines are formed with a spacing of, for example, 10 nm or less. Note that, in FIG. 4A, the spacing (the pitch) between the grid lines is illustrated remarkably wider than the actual one, for the sake of convenience in illustration. The same applies to the other drawings.

Referring back to FIG. 3A, the pair of short scales 56S are each fixed on the lower surface of mask holder 40. Short scale 56S is configured similarly to long scale 56L except that the length in the X-axis direction of short scale 56S is shorter than that of long scale 56L. That is, also in short scale 56S, an X scale 56Sx and a Y scale 56Sy are formed in an area on one side and an area on the other side in a width direction, respectively. Note that, although the plurality of grid lines are illustrated in solid lines and short scale 56S is illustrated as if facing upward in FIG. 4A, the plurality of short scales 56S are disposed with the grating surfaces facing downward in actuality as illustrated in FIG. 1. Further, although short scale 56S is disposed slightly shifted with respect to long scale 56L in the Y-axis direction in the present embodiment, short scale 56S may be disposed at the same Y position as long scale 56L. Similarly to encoder base 52 described above, mask holder 40 is also formed of a material with a thermal expansion coefficient lower than (or equal to) that of short scales 56S.

As illustrated in FIG. 4A, head stage 54 is made up of a plate-like member with a rectangular shape in planar view, and is driven, synchronously with mask holder 40, with a long stroke in the X-axis direction by a head stage driving system 82 (see FIG. 6) including an actuator such as, for example, a liner motor. Further, mask stage device 14 (see FIG. 1) has, for example, a mechanical linear guide device for straightly guiding head stage 54 in the X-axis direction.

A pair of X long heads 58Lx and a pair of Y long heads 58Ly (collectively referred to as long heads 58L, as needed) are fixed to head stage 54. Long heads 58L are encoder heads of a so-called diffraction interference method, like those disclosed in, for example, U.S. Patent Application Publication No. 2008/0094592, and supply the position information (or the displacement amount information) of head stage 54 to a main controller 90 (see FIG. 6), by irradiating long scales 56L with measurement beams and receiving the beams from the scales.

That is, in mask encoder system 50, for example, the four X long heads (58Lx×2, 58Lx×2) and X long scales 56Lx (which differ depending on the X-position of head stage 54) that face these X long heads configure, for example, four X long linear encoders 92Lx (see FIG. 6) for obtaining the position information of head stage 54 in the X-axis direction, and for example, the four Y long heads (58Ly×2, 58Ly×2) and Y long scales 56Ly (which differ depending on the X-position of head stage 54) that face these Y long heads configure, for example, four Y long linear encoders 92Ly (see FIG. 6) for obtaining the position information of head stage 54 in the Y-axis direction Main controller 90 obtains the position information of head stage 54 (see FIG. 4A) in the X-axis direction and the Y-axis direction with, for example, a resolution of 10 nm or less, on the basis of the outputs of, for example, the four X long linear encoder 92Lx and, for example, the four Y long linear encoders 92Ly, as illustrated in FIG. 6. Further, main controller 90 obtains the θz position information (the rotation amount information) of head stage 54, on the basis of the outputs of at least two of, for example, the four X long linear encoders 92Lx (or, for example, the four Y long linear encoders 92Ly).

Further, one X short head 58Sx and one Y short head 58Sy (collectively referred to as short heads 58S, as needed) are fixed to head stage 54. Short heads 58S are also encoder heads of a so-called diffraction interference method, similar to long heads 58L described above, and supply the relative position information between mask holder 40 and head stage 54 to main controller 90 (see FIG. 6), by irradiating short scales 56S with measurement beams and receiving the beams from the scales.

That is, in mask encoder system 50, for example, the two X short heads (58Sx) and X short scale 56Sx that faces these X short heads configure, for example, two X short linear encoders 92Sx (see FIG. 6) for obtaining the relative position information between mask holder 40 and head stage 54 in the X-axis direction, and for example, the two Y short heads (58Sy) and Y short scale 56Sy that faces these Y short heads configure, for example, two Y short linear encoders 92Sy (see FIG. 6) for obtaining the position information of head stage 54 in the Y-axis direction.

Consequently, head stage driving system 82 (see FIG. 6) described above relatively drives mask holder 40 and head stage 54 synchronously with mask holder 40 so that the measurement beams from short heads 58S are prevented from moving off from short scales 56S (so that short heads 58S follow short scales 56S). In other words, unless the measurement beams from short heads 58S move off from short scales 56S, the positions of mask holder 40 and head stage 54 at the time of movement do not have to completely coincide with each other. That is, in mask encoder system 50, a configuration is employed in which the relative positional shift between mask holder 40 and head stage 54 is allowed (the positional shift is compensated) by X short linear encoders 92Sx and Y short linear encoders 92Sy (see FIG. 6).

Here, as is described above, a plurality of long scales 56L are disposed spaced apart at a predetermined spacing in the X-axis direction on encoder base 52 (see FIG. 4A). And, a spacing between a pair of X long heads 58Lx and a spacing between a pair of Y long heads 58Ly that head stage 54 has are each set wider than a spacing between long scales 56L adjacent to each other. Further, the spacing between a pair of X long heads 58Lx and the spacing between a pair of Y long heads 58Ly are each set not equal to the length of long scale 56L. Accordingly, in mask encoder system 50, at least one of the pair of X long heads 58Lx constantly faces X long scale 56Lx, and at least one of the pair of Y long heads 58Ly constantly faces Y long scale 56Ly. Consequently, mask encoder system 50 can supply the position information of head stage 54 to main controller 90 (see FIG. 6) without interruption.

Specifically, for example, in the case where head stage 54 is moved to the −X side, mask encoder system 50 undergoes transition in the order of the following states: a first state (a state illustrated in FIG. 4A) where both of the pair of X long heads 58Lx face long scale 56Lx on the +X side of a pair of long scales 56Lx adjacent to each other; a second state where X long head 58Lx on the −X side faces an area between the forgoing pair of X long scales 56Lx adjacent to each other (does not face any one of X long heads 56Lx) and X long head 58Lx on the +X side faces the foregoing X long scale 56Lx on the +X side; a third state where X long head 58Lx on the −X side faces X long scale 56Lx on the −X side and also X long head 58Lx on the +X side faces X long scale 56Lx on the +X side; a fourth state where X long head 58Lx on the −X side faces X long scale 56Lx on the −X side and X long head 58Lx on the +X side faces an area between the pair of X long scales 56Lx (does not face any one of X long scales 56Lx); and a fifth state where both of the pair of X long heads 58Lx face X long scale 56Lx on the −X side. Consequently, at least one of X long heads 58Lx constantly faces X long scale 56Lx.

Main controller 90 (see FIG. 6) obtains the X-position information of head stage 54 on the basis of, for example, the average value of the outputs of the pair of X long heads 58Lx in the first state, the third state and the fifth state described above. Further, main controller 90 obtains the X-position information of head stage 54 on the basis of only the output of X long head 58Lx on the +X side in the second state described above, and obtains the X-position information of head stage 54 on the basis of only the output of X long heads 58Lx on the −X side in the fourth state described above. Consequently, the measurement values of mask encoder system 50 are not interrupted.

Figure 5A:
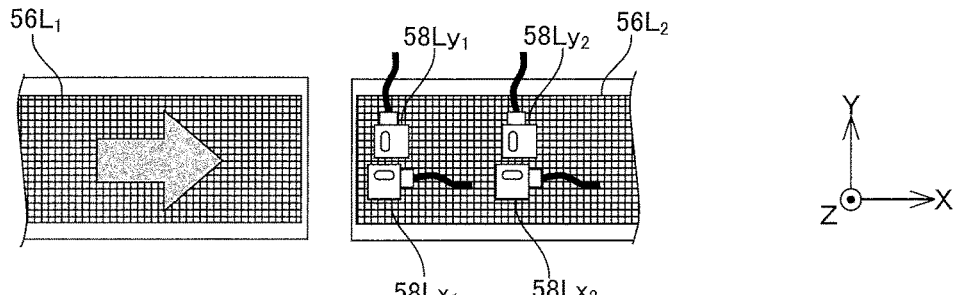
FIGS. 5A to 5E are views (No. 1 to No. 5) used to explain the linkage processing of head outputs in the mask encoder system and the substrate encoder system.
Figure 5B:
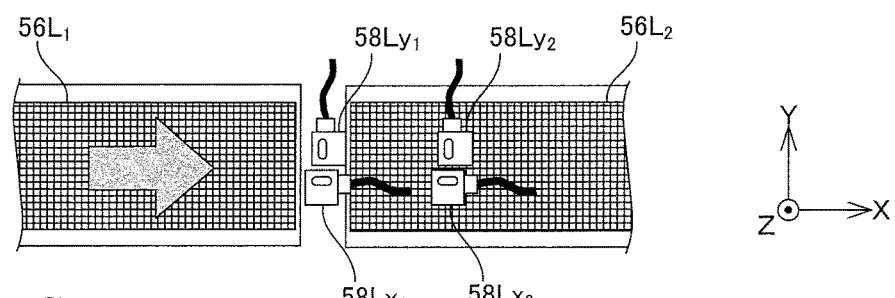

To be more detailed, in mask encoder system 50 of the present embodiment, in order to prevent the measurement values of mask encoder system 50 from being interrupted, the linkage processing of the outputs of the heads is performed, when the transition is made between: the first, the third and the fifth states described above, i.e., the states where both of the pair of heads face the scale(s) and the output is supplied from each of the pair of heads; and the second and the fourth states described above, i.e., the states where only one of the pair of heads faces the scale and the output is supplied from the only one head. The linkage processing of the heads will be described below, using FIGS. 5A and 5E. Note that, for the sake of simplified explanation, a two-dimensional grating (a grating) is assumed to be formed on long scale 56L in FIGS. 5A to 5E. Further, the respective outputs of long heads 58Lx and 58Ly are assumed to have the ideal values. Further, in the description below, although the linkage processing regarding a pair of X long heads 58Lx adjacent to each other (hereinafter, referred to as X heads $58Lx_1$ and $58Lx_2$) will be described, the similar linkage processing is also performed between a pair of Y long heads 58Ly adjacent to each other (hereinafter, referred to as Y heads $58Ly_1$ and $58Ly_2$), As illustrated in FIG. 5A, in the case where, of a pair of long scales 56L adjacent to each other (hereinafter, referred to as scales $56L_1$ and $56L_2$), each of the pair of X heads $58Lx_1$ and $58Lx_2$ obtains the X-position information of head stage 54 (see FIG. 4A) using scale $56L_2$ on the +X side, the pair of X heads $58Lx_1$ and $58Lx_2$ both output X-coordinate information. Here, the outputs of the pair of X heads $58Lx_1$ and $58Lx_2$ have the same values. Subsequently, as illustrated in FIG. 5B, when head stage 54 is moved in the −X direction, X head $58Lx_1$ will be out of a measurement range of scale $56L_2$, and therefore before X heads $58Lx_1$ is out of the measurement range, the output of X head $58Lx_1$ is treated as an invalid output. Consequently, the X-position information of head stage 54 is obtained on the basis of only the output of X head $58Lx_2$.

Figure 5C:
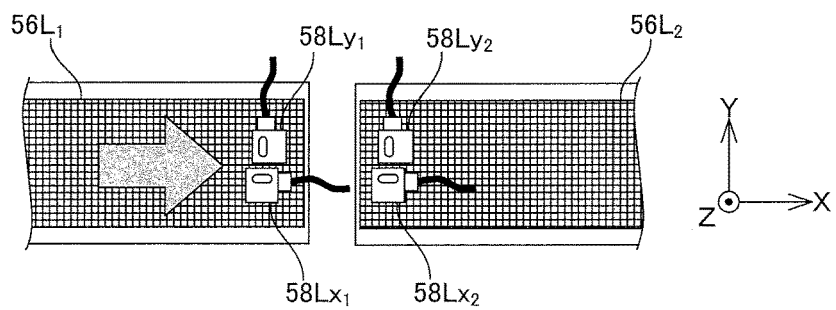

Further, as illustrated in FIG. 5C, when head stage 54 (see FIG. 4A) is moved further in the −X direction, X head $58Lx_1$ faces scale $56L_1$ on the −X side. Immediately after coming into a state of capable of performing a measurement operation using scale $56L_1$, X head $58Lx_1$ outputs the X-position information of head stage 54. However, since the counting of the output of X head $58Lx_1$ is resumed from an undefined value (or zero), the output of X head $58Lx_1$ cannot be used in computation of the X-position information of head stage 54. Consequently, in this state, the linkage processing of the respective outputs of the pair of X heads $58Lx_1$ and $58Lx_2$ is required. Specifically, as the linkage processing, the processing of correcting the output of X head $58Lx_1$ that shows the undefined value (or zero) using the output of X head $58Lx_2$ (e.g., so that the outputs show the same value) is performed. The linkage processing is completed before head stage 54 is moved further in the −X direction and X head $58Lx_2$ is out of the measurement range of scale $56L_2$, as illustrated in FIG. 5D.

Figure 5D:
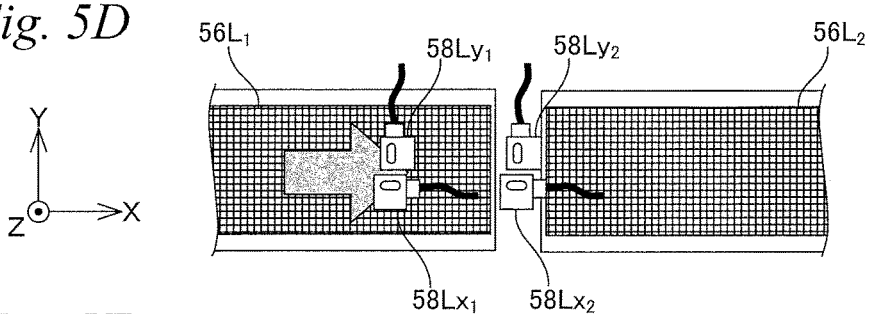
Figure 5E:
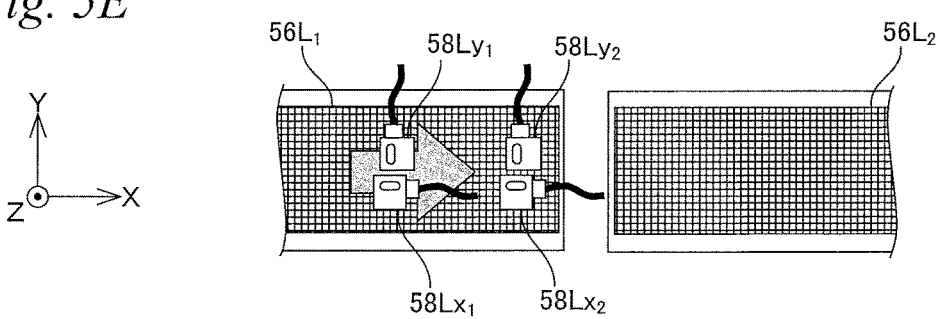

Similarly, as illustrated in FIG. 5D, in the case where X head $58Lx_2$ will be out of the measurement range of scale $56L_2$, the output of X head $58Lx_2$ is treated as an invalid output before X head $58Lx_2$ is out of the measurement range. Consequently, the X-position information of head stage 54 (see FIG. 4A) is obtained on the basis of only the output of X head $58Lx_1$. Then, as illustrated in FIG. 5E, mask holder 40 head stage 54 is moved further in the −X direction, and immediately after each of the pair of X heads $58Lx_1$ and $58Lx_2$ comes into a state capable of performing a measurement operation using scale $56L_1$, the linkage processing using the output of X head $58Lx_1$ is performed with respect to X head $58Lx_2$. After that, the X-position information of head stage 54 is obtained on the basis of the output of each of the pair of X heads $58Lx_1$ and $58Lx_2$.

Next, the configuration of substrate encoder system 60 will be described. As illustrated in FIG. 1, for example, four Y encoder bases 62Y are fixed on the lower surface of optical surface plate 18a. Note that, in FIG. 1, two of the four Y encoder bases 62Y are hidden behind the other two on the depth side of the page surface (see FIG. 3B). Further, for example, below the four Y encoder bases 62Y, a pair of X encoder bases 62X are disposed. Furthermore, below each of the pair of X encoder bases 62X, head stage 64 is disposed. Further, short scales 66S are fixed on the upper surface of substrate holder 24, corresponding to a pair of head stages 64.

Figure 3B:
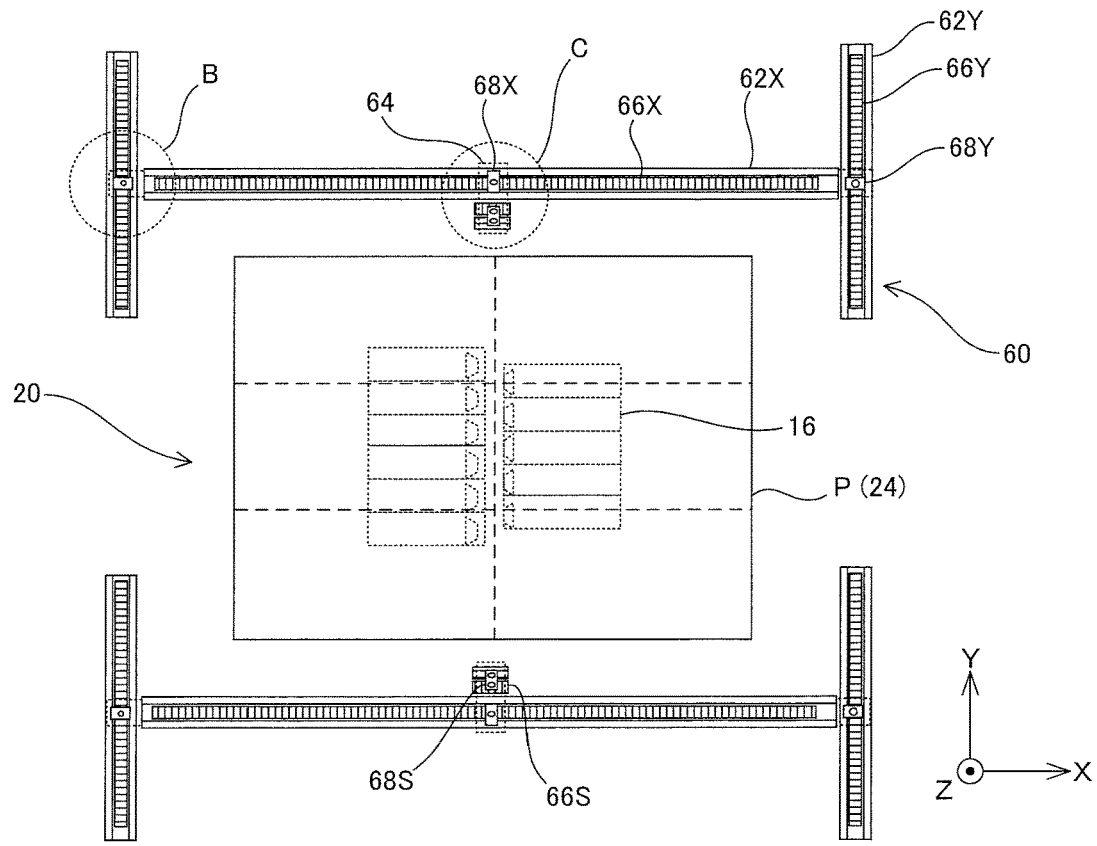
FIG. 3B is a plan view showing the configuration of the substrate encoder system.

As illustrated in FIG. 3B, Y encoder base 62Y is made up of a member extending in the Y-axis direction. For example, two of the four Y encoder bases 62Y are disposed on the +Y side of projection optical system 16, spaced apart in the X-axis direction, and the other two are disposed on the −Y side of projection optical system 16, spaced apart in the X-axis direction. A plurality of Y long encoder scales 66Y (hereinafter, referred to as Y long scales 66Y) are fixed on the lower surface of Y encoder base 62Y.

Figure 4B:
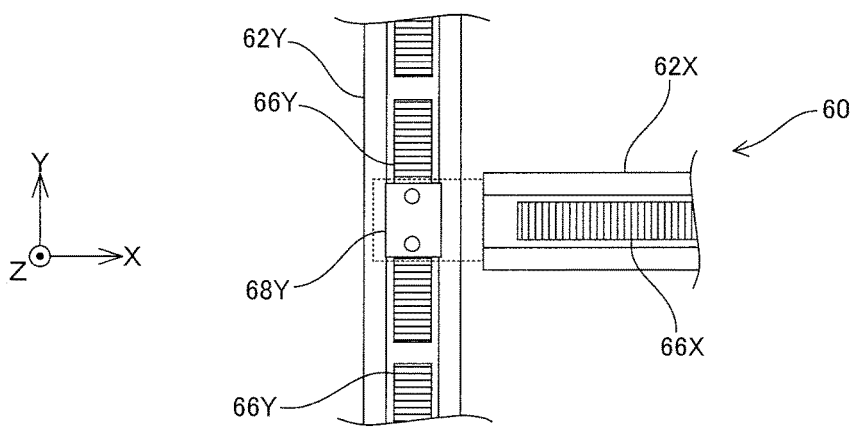
FIG. 4B is an enlarged view of a B-part of FIG. 3B.

Y long scale 66Y is made up of a plate-like (band-like) member that is formed of, for example, a quartz glass and has a rectangular shape in planar view extending in the Y-axis direction. As illustrated in FIG. 4B, Y long scale 66Y is configured of a reflective diffraction grating (a Y grating) having a plurality of grid lines formed at a predetermined pitch in the Y-axis direction (with the Y-axis direction serving as a period direction) and extending in the X-axis direction. Note that, although the grid lines are illustrated in solid lines and Y long scales 66Y are illustrated as if facing upward in FIGS. 3B and 4B, the plurality of Y long scales 66Y are disposed with the grating surfaces facing downward in actuality, as illustrated in FIG. 1.

The grating pitch and the like of Y long scale 66Y may be the same as or may be different from those of Y scale 56Ly described above (see FIG. 4A). Encoder base 62Y described above is formed of a material with a thermal expansion coefficient lower than (or equal to) that of Y long scale 66Y so that the grating pitch is prevented from changing due to, for example, the change in temperature and the like.

Referring back to FIG. 3B, X encoder base 62X is made up of a member extending in the X-axis direction, and is stretched between a pair of Y encoder bases 62Y spaced apart in the X-axis direction. A pair of X encoder bases 62X are driven with a predetermined stroke synchronously with substrate holder 24 in the Y-axis direction, by an X base driving system 84 (see FIG. 6). For example, a mechanical linear guide device for straightly guiding X encoder bases 62X in the Y-axis direction is provided between Y encoder bases 62Y and X encoder base 62X.

A pair of Y long heads 68Y are fixed at each of both end-vicinities of X encoder base 62X. Y long heads 68Y are encoders heads of a diffraction interference method similar to long heads 58L described above (see FIG. 4A), and supply the position information of X encoder base 62X in the Y-axis direction to main controller 90 (see FIG. 6) by irradiating Y scales 66Y with measurement beams and receiving the beams from the scales.

That is, in substrate encoder system 60, for example, four (2×2) Y long heads 68Y and Y long scales 66Y (which differ depending on the Y-position of X encoder bases 62X) that correspond to these Y long heads configure, for example, four Y long linear encoders 96Ly (see FIG. 6) for obtaining the position information of X encoder bases 62X in the Y-axis direction.

Here, as illustrated in FIG. 4B, similarly to long scales 56L described above (see FIG. 4A), a plurality of Y long scales 66Y are also disposed at a predetermined spacing in the Y-axis direction. Further, the spacing between a pair of Y long heads 68Y is set wider than the spacing between Y long scales 66Y adjacent to each other. Accordingly, in substrate encoder system 60, at least one of the pair of Y long heads 68Y constantly faces Y long scale 66Y. Consequently, in substrate encoder system 60, the position information of X encoder base 62X (see FIG. 3A) can be obtained without interrupting the measurement values. Therefore, also in this case, the linkage processing similar to the linkage processing (see FIGS. 5A to 5E) of the head outputs in mask encoder system 50 described above is performed.

Figure 4C:
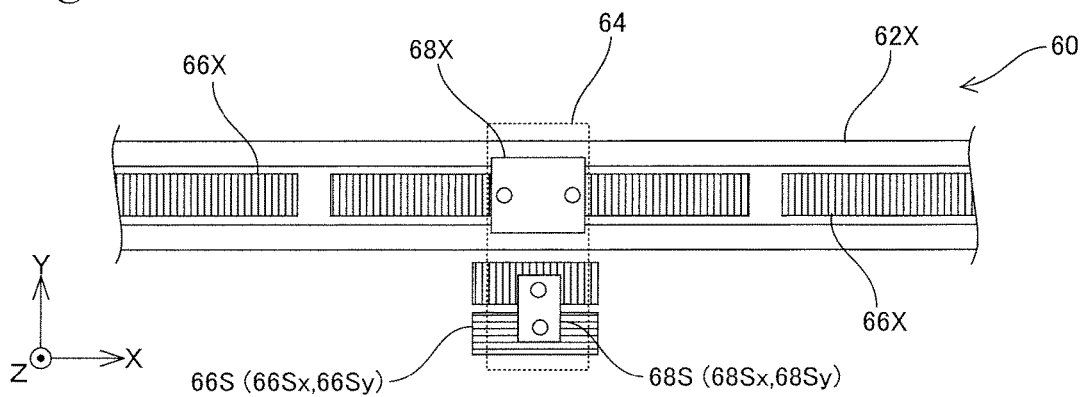
FIG. 4C is an enlarged view of a C-part of FIG. 3B.

A plurality of X long encoder scales 66X (hereinafter, referred to as X long scales 66X) are fixed on the lower surface of X encoder base 62X. X long scale 66X is made up of a plate-like (band-like) member that is formed of, for example, a quartz glass and has a rectangular shape in planar view extending in the X-axis direction. As illustrated in FIG. 4C, X long scale 66X is configured of a reflective diffraction grating (an X grating) having a plurality of grid lines formed at a predetermined pitch in the X-axis direction (with the X-axis direction serving as a period direction) and extending in the Y-axis direction. Note that, although grid lines are illustrated in solid lines and X long scales 66X are illustrated as if facing upward in FIGS. 3B, 4B and 4C, the plurality of X long scales 66X are disposed with the grating surfaces facing downward in actuality as illustrated in FIG. 1. Note that, although X long scale 66X has the grid lines formed at a predetermined pitch in the X-axis direction, this is not intended to be limiting, and may have grid lines formed at a predetermined pitch in both of the X-axis direction and the Y-axis direction. Similarly, although Y long scale 66Y has the grid lines formed at a predetermined pitch in the Y-axis direction, this is not intended to be limiting, and may have grid lines formed at a predetermined pitch in both of the X-axis direction and the Y-axis direction.

As illustrated in FIG. 4C, head stage 64 is made up of a plate-like member with a rectangular shape in planar view and is driven with a long stroke synchronously with substrate holder 24 in the X-axis direction, by a head stage driving system 86 (see FIG. 6) including an actuator such as, for example, a liner motor. For example, a mechanical linear guide device for straightly guiding head stage 64 in the X-axis direction is provided between head stage 64 and X encoder base 62X. Further, the relative movement of head stage 64 in the Y-axis direction with respect to encoder base 62X is restricted, and head stage 64 is moved in the Y-axis direction synchronously with X encoder base 62X when X encoder base 62X is driven in the Y-axis direction.

A pair of X long heads 68X are fixed to head stage 64. X long heads 68X are encoder heads of a diffraction interference method similar to long heads 58L described above (see FIG. 4A), and supply the position information of head stage 64 in the X-axis direction to main controller 90 (see FIG. 6) by irradiating X long scales 66X with measurement beams and receiving the beams from the scales.

That is, in substrate encoder system 60, for example, the four (2×2) X long heads 68X and X long scales 66X (which differ depending on the X-position of head stages 64) that correspond to these X long heads configure, for example, four X long linear encoders 96Lx (see FIG. 6) for obtaining the position information of head stages 64 in the X-axis direction.

Further, one X short head 68Sx and one Y short head 68Sy (collectively referred to as short heads 68S, as needed) are fixed to head stage 64. Short heads 68S are also encoder heads of a diffraction interference method similar to X long heads 68X described above, and supply the relative position information between substrate holder 24 and head stage 64 to main controller 90 (see FIG. 6) by irradiating short scales 66S with measurement beams and receiving the beams from the scales.

Short scale 66S is substantially the same as short scale 56S (see FIG. 3A) fixed to mask holder 40 described above. That is, short scale 66S has an X scale 66Sx and a Y scale 66Sy. Further, short scale 66S is disposed slightly shifted relative to X long scale 66X in the Y-axis direction, but may be disposed at the same Y-position as X long scale 66X. Similarly to X encoder base 62X described above, substrate holder 24 is also formed of a material with a thermal expansion coefficient lower than (or equal to) that of short scale 66S.

That is, in substrate encoder system 60, for example, the two X short heads 68Sx and X short scales 66Sx that face these X short heads configure, for example, two X short linear encoders 98Sx (see FIG. 6) for obtaining the relative position information between head stage 64 and substrate holder 24 in the X-axis direction, and for example, the two Y short heads 68Sy and Y short scales 66Sy that face these Y short heads configure, for example, two Y short linear encoders 98Sy (see FIG. 6) for obtaining the relative position information between head stage 64 and substrate holder 24 in the Y-axis direction.

Consequently, X base driving system 84 and head stage driving system 86 described above (see FIG. 6 for each of them) relatively drive X encoder bases 62X and head stages 64 with respect to substrate holder 24, respectively, synchronously with substrate holder 24 so that the measurement beams from short heads 68S are prevented from moving off from short scales 66X (so that short heads 68S follow short scales 66S). In other words, unless the measurement beams from short heads 68S move off from short scales 66S, the positions of substrate holder 24 and head stages 64 at the time of movement do not completely have to be coincide with each other. That is, in substrate encoder system 60, a configuration is employed in which the relative positional shift between substrate holder 24 and head stages 64 is allowed (the positional shift is compensated) by X short linear encoders 98Sx and Y short linear encoders 98Sy (see FIG. 6).

In FIG. 6, a block diagram is illustrated that shows the input/output relationship of main controller 90 that centrally configures the control system of liquid crystal exposure apparatus 10 (see FIG. 1) and performs the overall control of the respective components. Main controller 90 includes a workstation (or a microcomputer) and the like, and performs the overall control of the respective components of liquid crystal exposure apparatus 10.

In liquid crystal exposure apparatus 10 (see FIG. 1) configured as described above, under the control of main controller 90 (see FIG. 6), mask M is placed onto mask stage device 14 by a mask loader (not illustrated) and also substrate P is loaded onto substrate stage device 20 (substrate holder 24) by a substrate loader (not illustrated). After that, main controller 90 implements alignment measurement using an alignment detection system (not illustrated), and after the alignment measurement is finished, the exposure operation of a step-and-scan method are sequentially performed with respect to a plurality of shot areas set on substrate P.

Since the operations of mask stage device 14 and substrate stage device 20 at the time of the exposure operation of step-and-scan method referred to above are the same as the operations in a conventional exposure apparatus, the description thereof will be omitted.

Further, at the time of the exposure operation of step-and-scan method referred to above, in mask encoder system 50, a pair of head stages 54 are driven in the scan direction, synchronously with the movement (acceleration, movement at a constant speed, and deceleration) of mask M in the scan direction.

Figure 7A:
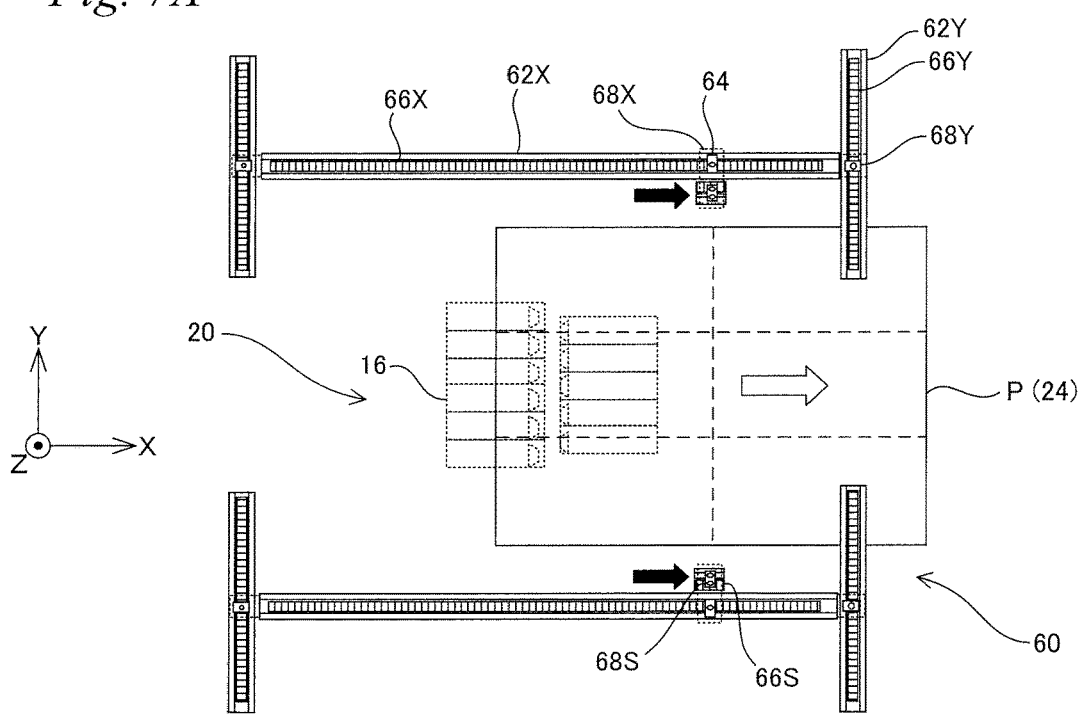
FIGS. 7A and 7B are views (No. 1 and No. 2) used to explain the operations of the substrate encoder system at the time of exposure operation.
Figure 7B:
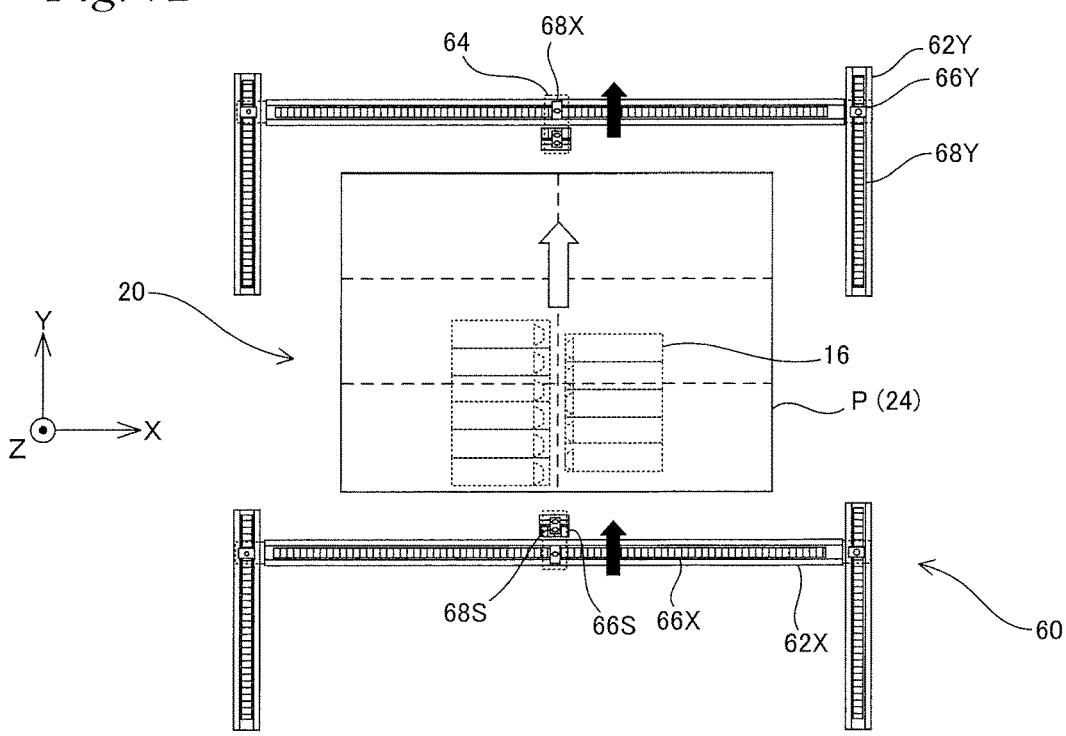

Further, at the time of the exposure operation of step-and-scan method referred to above, in substrate encoder system 60, as illustrated in FIG. 7A, when substrate P (substrate holder 24) is driven in the X-axis direction for the scan exposure operation, the pair of head stages 64 are driven synchronously with substrate P in the X-axis direction. On this occasion, the pair of X encoder bases 62X are in a static state. On the other hand, as illustrated in FIG. 7B, when substrate P (substrate holder 24) is driven in the Y-axis direction for inter-shot-area movement, the pair of head stages 64 are moved integrally with the pair of X encoder bases 62X in the Y-axis direction. Consequently, the measurement beams from short heads 68S do not move off from short scales 66S.

As is described above, according to liquid crystal exposure apparatus 10 related to the present embodiment, in each of mask encoder system 50 for obtaining the position information of mask M within the XY plane and substrate encoder system 60 for obtaining the position information of substrate P within the XY plane (see FIG. 1 for each of them), the optical path length of the measurement beam that is irradiated to the corresponding scale is short, and therefore, the influence of air fluctuation can be reduced, for example, compared to a conventional interferometer system. Consequently, the positioning accuracy of mask M and substrate P is improved. Further, since the influence of air fluctuation is small, a partial air conditioning equipment that is essential in the case of using the conventional interferometer system can be omitted, which allows the cost to be reduced.

Moreover, in the case of using the interferometer system, a large and heavy bar mirror is required to be equipped in mask stage device 14 and substrate stage device 20. However, since such a bar mirror is unnecessary in mask encoder system 50 and substrate encoder system 60 related to the present embodiment, a system including mask holder 40 and a system including substrate holder 24 are each downsized and lightened and also the better weight balance is obtained, and accordingly the position controllability of mask M and substrate P is improved. Further, the points to be adjusted can be decreased, compared to the case of using the interferometer system, which leads to the cost reduction of mask stage device 14 and substrate stage device 20 and further leads to the improved maintainability. Furthermore, the adjustment at the time of assembly becomes easier (or unnecessary).

Further, in substrate encoder system 60 related to the present embodiment, since a configuration is employed in which, for example, the Y-position information of substrate P is obtained by driving the pair of head stages 64 synchronously with substrate P (causing the pair of head stages 64 to follow substrate P) in the Y-axis direction, a scale extending in the Y-axis direction needs not be disposed on the substrate stage device 20 side (or a plurality of heads needs not be arrayed in the Y-axis direction on the apparatus main body 18 side). Consequently, the configuration of the substrate position measurement system can be simple, which allows the cost to be reduced.

Further, in mask encoder system 50 related to the present embodiment, since a configuration is employed in which the position information of mask holder 40 within the XY plane is obtained while the outputs of a pair of encoder heads (X heads 58Lx, Y heads 58Ly) adjacent to each other are switched as needed depending on the X-position of mask holder 40, the position information of mask holder 40 can be obtained without interruption even if a plurality of scales 56L are disposed at a predetermined spacing (spaced apart from each other) in the X-axis direction. Consequently, a scale with a length equivalent to the movement stroke of mask holder 40 needs not be prepared, which allows the cost to be reduced, and mask encoder system 50 is suitable, in particular, for liquid crystal exposure apparatus 10 using mask M of a large size as in the present embodiment. Similarly, also in substrate encoder system 60 related to the present embodiment, since a plurality of scales 66X are disposed at a predetermined spacing in the X-axis direction and a plurality of scales 66Y are disposed at a predetermined spacing in the Y-axis direction, a scale with a length equivalent to the movement stroke of substrate P needs not be prepared, and substrate encoder system 60 is suitable for liquid crystal exposure apparatus 10 using substrate P of a large size.

Further, although short scales 66S in the present embodiment are fixed on the upper surface of substrate holder 24, this is not intended to be limiting, and may be fixed on the lower surface of substrate holder 24. In such a case, head stage 64 may be configured of two stages that are a head stage 64a and a head stage 64b. Head stage 64a is disposed to face X encoder base 62X, and head stage 64b is disposed to face short scales 66S fixed on the lower surface of substrate holder 24. In other words, head stage 64a is disposed between optical surface plate 18a and substrate holder 24, and head stage 64b is disposed below substrate holder 24. In this case, head stage 64a and head stage 64b are synchronously moved within a two-dimensional plane including the X-axis direction and the Y-axis direction. Note that head stage 64a and head stage 64b may mechanically be coupled, or electrical control may be performed so that head stage 64a and head stage 64b are synchronously driven. Note that, although the explanation is given that head stage 64a and head stage 64b are synchronously moved, this means that head stage 64a and head stage 64b are moved in a state of roughly maintaining the relative positional relationship between head stage 64a and head stage 64b, and is not limited to the case of moving head stage 64a and head stage 64b in a state where the positional relationship between head stage 64a and head stage 64b, their movement directions, and their movement velocities strictly coincide with each other.

Figure 11:
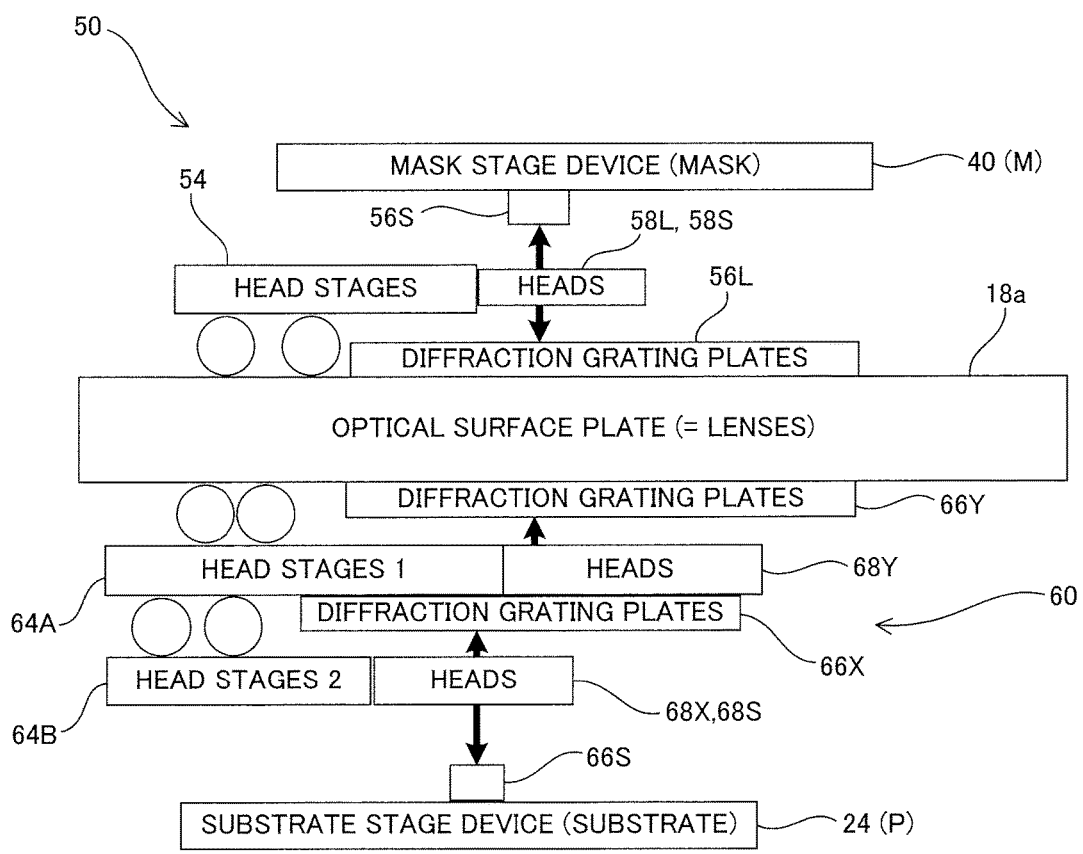
FIG. 11 is a concept view of the mask encoder system and the substrate encoder system equipped in the liquid crystal exposure apparatus shown in FIG. 1.

Further, in substrate encoder system 60 related to the present embodiment, although X encoder base 62X is disposed below Y encoder base 62Y, X encoder base 62X may be provided at head stage 64. As illustrated in FIG. 11, head stage 64 may be configured of two stages that are head stage 64A and head stage 64B. Y heads 68Y are disposed on the upper surface of head stage 64A, and X long scales 66X are disposed on the lower surface of head stage 64A. X heads 68X are disposed on the upper surface of head stage 64B, and short heads 68S are disposed on the lower surface of head stage 64B. When substrate holder 24 is moved in the X-axis direction, head stage 64B is moved in the X-axis direction synchronously with the movement of substrate holder 24. Note that head stage 64A is not moved in either the X-axis direction or the Y-axis direction. Further, when substrate holder 24 is moved in the Y-axis direction, head stage 64A and head stage 64B are synchronously moved in the Y-axis direction so as to be synchronized with the movement of substrate holder 24.

Second Embodiment

Figure 8:
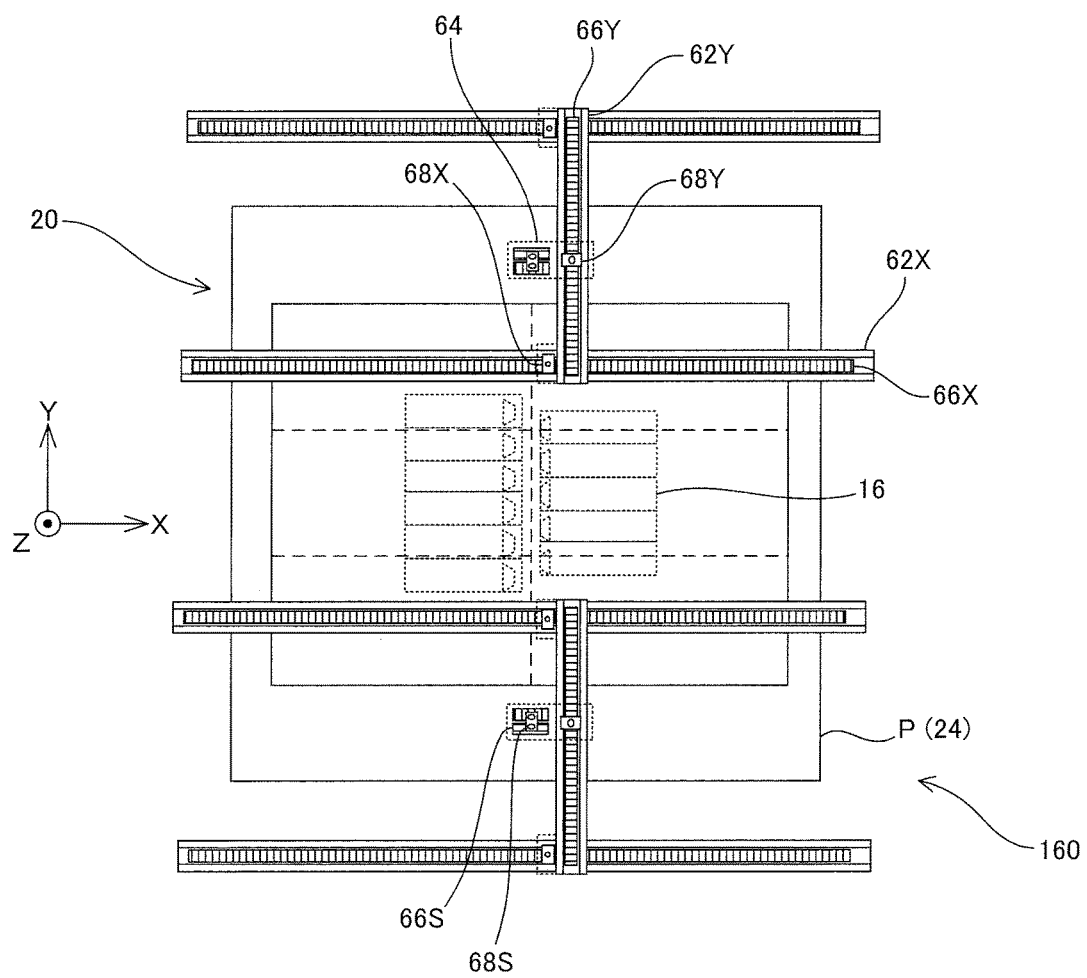
FIG. 8 is a view showing the configuration of a substrate encoder system related to a second embodiment.

Next, a liquid crystal exposure apparatus related to a second embodiment will be described using FIG. 8. The configuration of the liquid crystal exposure apparatus related to the second embodiment is the same as the first embodiment described above except that the configuration of a substrate encoder system 160 is different. Therefore, only the differences will be described below, and elements that have the same configurations and functions as those in the first embodiment described above will be provided with the same reference signs as those in the first embodiment described above, and the description thereof will be omitted.

In substrate encoder system 160 in the present second embodiment, the configuration of a drive system for driving short head 68S is different, compared to the first embodiment described above. That is, in the first embodiment described above, as illustrated in FIG. 3C 3B, a pair of Y encoder bases 62Y (fixed) and one X encoder base 62X (movable) stretched between the pair of Y encoder bases 62Y are used for one short head 68S, whereas in the present second embodiment, as illustrated in FIG. 8, a pair of X encoder bases 62X (fixed) and one Y encoder base 62Y (movable) stretched between the pair of X encoder bases 62X are used. The present second embodiment can also obtain the similar effect to the first embodiment described above.

Note that the respective configurations of the first embodiment and the second embodiment are merely examples, and can be changed as needed. For example, image sensors (cameras) or fiducial marks are attached to head stages 54 and 64, and calibration related to the projection lenses may be performed using the image sensors. In this case, since the calibration referred to above can be performed without using mask holder 40 and substrate holder 24, good efficient is obtained.

Further, in substrate encoder system 60 in the embodiments described above, although the relative position information between head stages 64 and substrate holder 24 is obtained by the encoder system that includes short heads 68S attached to head stages 64 and short scales 66X fixed to substrate holder 24, this is not intended to be limiting. Since a relative movement amount between head stages 64 and substrate holder 24 is small, the relative position information between head stages 64 and substrate holder 24 may be obtained by, for example, forming marks at substrate holder 24 and attaching image sensors to head stages 64, and observing the marks with the image sensors and performing the image processing with high speed.

Further, the arrangement of each of the scales and the heads corresponding thereto may be reversed in each of the embodiments described above. For example, short heads 68S may be fixed to substrate holder 24 and short scales 66S may be fixed to head stages 64.

Figure 9:
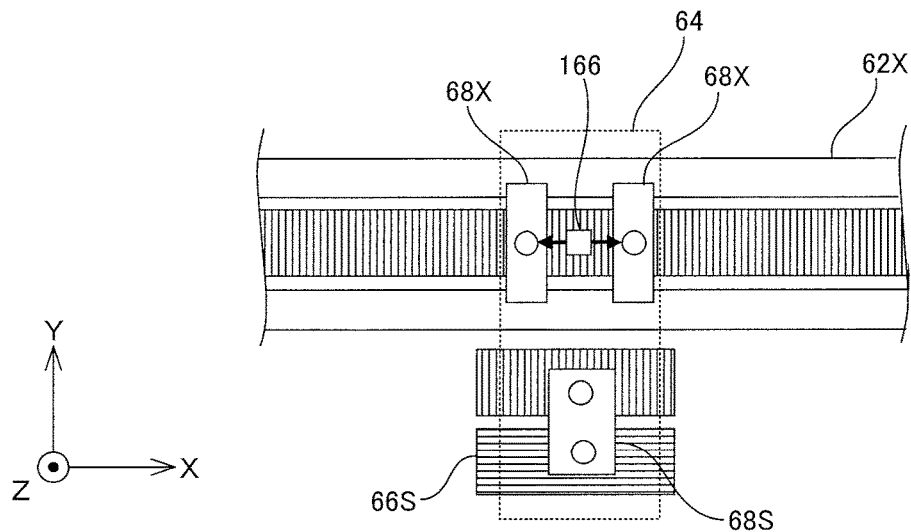
FIG. 9 is a view used to explain the configuration of a measurement system for obtaining the distance between a pair of heads.

Further, as illustrated in FIG. 9, the distance between the pair of X long heads 68X that head stage 64 has may be measured by a sensor 166 and the output of substrate encoder system 60 may be corrected using the measurement values. The type of sensor 166 is not particularly limited, and for example, a laser interferometer or the like can be used. As is described above, the linkage processing of the outputs of the pair of encoder heads is performed in substrate encoder system 60, and it is the precondition in this linkage processing that the distance between the pair of encoder heads is known and invariable. Therefore, head stage 64 to which each of the heads is attached is made of, for example, a material less affected by thermal expansion and the like. However, the position information of substrate P can be obtained with high accuracy by measuring the distance between the encoder heads as in the present modified example, even if head stage 64 is deformed (the distance between the pair of encoder heads is changed). Similarly, the distance between a pair of X long heads 58Lx that head stage 54 of mask encoder system 50 has and the distance between a pair of Y long heads 68Y fixed to X encoder base 62X of substrate encoder system 60 may be measured. Further, the relative positional relationships between all (e.g., eight in total in the present embodiment) of the heads (the pairs of downward heads 66x and 66y, and the pairs of upward heads 64x and 64y) that stage 64 has may be each measured, and the measurement values may be corrected.

Further, as is described above, a calibration operation may be performed in which the distance between a pair of X long heads 68X that head stage 64 has is measured as needed (e.g. at every substrate exchange). Further, separately from a calibration point for performing the foregoing measurement of the distances between the heads, another calibration point for performing the positioning of the origins of the respective outputs of mask encoder system 50 and substrate encoder system 60 may be provided. For example, positioning marks for performing the positioning of the origins may be disposed on the extended lines of (on the outer side of) the plurality of scales 56L, 66Y and 66X, or may be disposed between a pair of scales 56L adjacent to each other, a pair of scales 66Y adjacent to each other and a pair of scales 66X adjacent to each other, or may be formed in scales 56L, 66Y and 66X.

Figure 10:
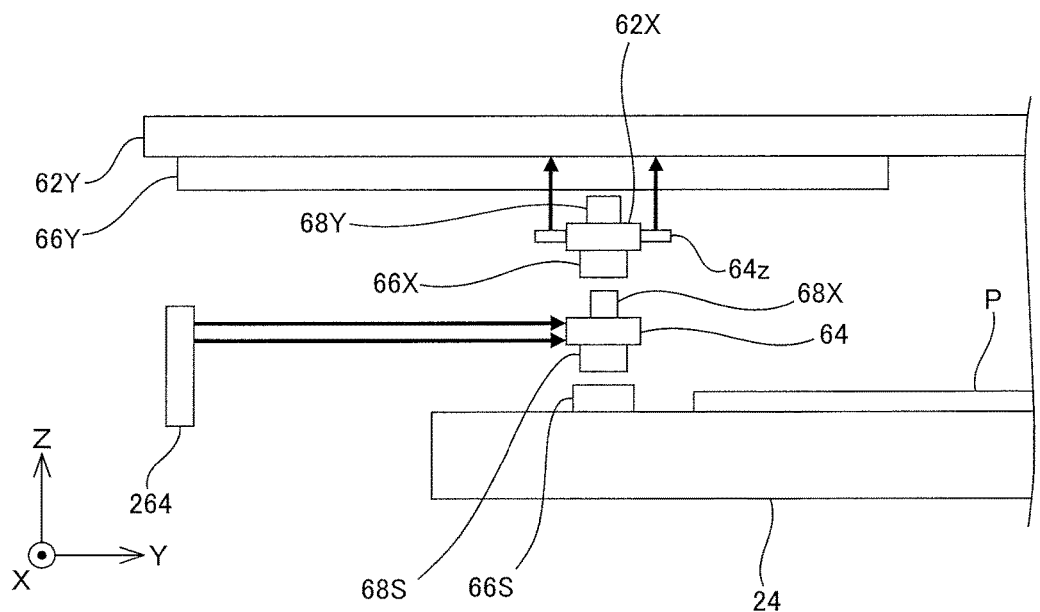
FIG. 10 is a view used to explain the configuration of a measurement system for obtaining a tilt amount of a head stage.

Further, the amount of tilt (inclination in the θx direction and the θy direction) of each of head stages 54 and 64 and X encoder base 62X with respect to the horizontal plane may be obtained, and the output of substrate encoder system 60 may be corrected in accordance with the tilt amount (the inclined amount of the optical axis of each of encoder heads 58L, 58S, 68Y, 68X and 68S). As a measurement system, as illustrated in FIG. 10, a measurement system in which a plurality of Z sensors 64z are attached to a target object (although the target object is X encoder base 62X in FIG. 10, head stage 64 may be the target object) and the tilt amount of the target object is obtained with Y encoder base 62Y (or upper mount section 18a) serving as a reference can be used. Alternatively, a biaxial laser interferometer 264 may be provided, and the tilt amount (the inclination amount in the θx direction and the θy direction) and the rotation amount (the rotation amount in the θz direction) of the target object (although the target object is head stage 64 in FIG. 10, X encoder base 62X may be the target object) may be obtained. Further, the tilt amount of each of heads 58L, 58S, 68Y, 68X and 68S may be individually measured.

Further, the case has been described where a plurality of long scales 56L are disposed spaced apart in the X-axis direction in mask encoder system 50, and a plurality of Y long scales 66Y are disposed spaced apart in the Y-axis direction and a plurality of X long scales 66X are disposed spaced apart in the X-axis direction in substrate encoder system 60, the number of the scales are not limited thereto, but may be changed as needed depending on, for example, the size of mask M, the size of substrate P or the movement strokes. Further, a plurality of scales do not necessarily have to be disposed spaced apart, and one longer scale may be used.

Further, in the case of providing a plurality of scales, the respective lengths of the scales may be different from one another. For example, the length of the scale extending in the X-axis direction is set longer than the length of a shot area in the X-axis direction, and thereby the linkage processing at the time of the scanning exposure operation can be avoided. The same applies to the scale extending in the Y-axis direction. Further, in order to cope with the change in the number of the shot areas (for example, in the case of preparing four areas and the case of preparing six areas), a scale disposed on one side of projection optical system 16 and a scale disposed on the other side may have the respective lengths different from each other.

Further, although the case has been described where X long scale 56Lx and Y long scale 56Ly are independently formed on the surface of long scale 56L, this is not intended to be limiting, and for example, an XY two-dimensional scale may be used. In this case, as the encoder head, an XY two-dimensional head can be used. The same applies to the short scale and the short head. Although the case of using the encoder system of a diffraction interference method has been described, this is not intended to be limiting, and the other encoder such as an encoder of a so-called pick-up method and an encoder of a magnetic method can be used, and a so-called scan encoder that is disclosed in, for example, U.S. Pat. No. 6,639,686 and the like can also be used.

Further, although Y encoder base 62Y that has Y long scales 66Y is configured to be directly attached to the lower surface of optical surface plate 18a, this is not intended to be limiting, and a predetermined base member may be disposed in a suspended manner in a state spaced apart from the lower surface of optical surface plate 18a.

Further, substrate stage device 20 only has to drive substrate P with a long stroke at least along the horizontal plane, and the fine positioning in the directions of six degrees of freedom needs not be performed according to the circumstances. The substrate encoder system related to each of the embodiments described above can also be suitably applied to such a two-dimensional stage device.

Further, it has been descried that, in the case where the pair of X long heads 58Lx both face the long scale, main controller 90 (see FIG. 6) obtains the X-position information of head stage 54 on the basis of the averaged value of the outputs of long heads 58Lx, but this is not intended to be limiting. By providing the master-slave relationship to the pair of X long heads 58Lx, the X-position information of head stage 54 may be obtained on the basis of only the value of one X long head 58Lx.

Further, in the case where a plurality of scale groups (scale rows) on optical surface plate 18a, in each of which a plurality of scales are arranged in line in the X-axis direction via a gap of a predetermined spacing, are disposed at different positions spaced from each other in the Y-axis direction (e.g., the position on one side (the +Y side) and the position on the other side (the −Y side) with respect to projection optical system 16), the positions of the gaps of the predetermined spacing described above may be disposed not to overlap in the X-axis direction among the plurality of scale rows. By disposing the plurality of scale rows in this manner, the heads placed corresponding to the respective scale rows can be prevented from being simultaneously located outside the measurement range (in other words, both the heads can be prevented from simultaneously facing the gaps).

Further, in each of the embodiments described above, although there is the description that X encoder bases 62X or head stages 64 are moved synchronously with substrate holder 24, this means that X encoder bases 62X or head stages 64 are moved in a state of roughly maintaining the relative positional relationship with substrate holder 24, and is not limited to the case where X encoder bases 62X or head stages 64 and substrate holder 24 are moved in a state where the positional relationship between X encoder bases 62X or head stages 64 and substrate holder 24, their movement directions, and their movement velocities strictly coincide with each other.

Further, in the case where a plurality of scale groups (scale rows) on optical surface plate 18a, in each of which a plurality of scales are arranged in line in the X-axis direction via a gap of a predetermined spacing, are disposed at different positions spaced from each other in the Y-axis direction (e.g., the position on one side (the +Y side) and the position on the other side (the −Y side) with respect to projection optical system 16), a configuration may be employed in which these plurality of scale groups (the plurality of scales rows) can be used properly depending on the arrangement of shots (the shot map) on the substrate. For example, by making the length of each of the plurality of scale rows as a whole different between the scale rows, the different shot maps can be coped with, and the change in the number of shot areas formed on the substrate such as the case of preparing four areas and the case of preparing six areas can be coped with. Along with disposing the plurality of scales rows in this manner, by making the respective positions of gaps in the scales rows different from each other in the X-axis direction, the heads respectively corresponding to the plurality of scale rows do not simultaneously located outside the measurement range, and therefore the number of sensors whose measurement values are regarded as undefined values can be reduced in the linkage processing, which allows the linkage processing to be performed with high accuracy.

Further, in the scale groups (the scale rows) on optical surface plate 18a, in each of which a plurality of scales are arranged in line via a gap of a predetermined spacing in the X-axis direction, the length of one scale (a pattern for X-axis measurement) in the X-axis direction may be set to a length which allows the measurement corresponding to the length of one shot area to be continuously performed (a length along which a device pattern is formed on a substrate by being irradiated when scan exposure is performed while moving the substrate on a substrate holder in the X-axis direction). By setting the length of one scale in the X-axis direction in this manner, the transfer control of heads with respect to a plurality of scales does not have to be performed during the scan exposure of one shot area, and therefore the position measurement (the position control) of substrate P (the substrate holder) during the scan exposure can be performed easily.

Further, in the scale groups (the scale rows) on mask holder 40, in each of which a plurality of scales are arranged in line via a gap of a predetermined spacing in the X-axis direction, the scales with the same length are arranged in line in the embodiments described above, but the scales with lengths different from each other may be arranged in line. For example, in a scale row on mask holder 40, the length in the X-axis direction of scales disposed in the central part may be set physically longer than the length in the X-axis direction of scales disposed near both ends in the X-axis direction (scales disposed at the respective ends in a scale row).

Further, in each of the embodiments described above, although a pair of X heads and a pair of Y heads are disposed in line in the X-axis direction so as to be each paired (the X heads and the Y heads are disposed in the same position in the X-axis direction), the X heads and the Y heads may be disposed relatively shifted in the X-axis direction.

Further, in the case where, while a given head stage 54 and a scale row corresponding thereto (a scale row in which a plurality of scales are arranged in line via a predetermined gap in a predetermined direction) are being relatively moved in the X-axis direction, a given set of heads in head stage 54 simultaneously face the gap between the foregoing scales, and then simultaneously face another scale, the measurement initial values of the heads that have transferred need to be computed. On this computation, by using the outputs of a remaining set of heads in head stage 54 that are different from the heads that have transferred and the output of yet-another head that is different from these heads (a head spaced apart in the X-axis direction and disposed at a position whose distance from the heads having moved off from the scale is shorter than the scale length), the initial values on the transfer of the heads that have transferred may be computed. The foregoing yet-another head may be either of a head for position measurement in the X-axis direction or a head for position measurement in the Y-axis direction.

Further, in substrate encoder system 60 related to each of the embodiments described above, in order to acquire the position information of substrate stage device 20 while substrate stage device 20 is moved to a substrate exchange position with respect to the substrate loader, a scale for substrate exchange may be provided at substrate stage device 20 or another stage device, and the position information of substrate stage device 20 may be acquired using the downward heads (such as X heads 68sx). Alternatively, a head for substrate exchange may be provided at substrate stage device 20 or another stage device, and the position information of substrate stage device 20 may be acquired by measuring the scales or a scale for substrate exchange.

Further, in mask encoder system 50 related to each of the embodiments described above, in order to acquire the position information of mask stage device 14 while mask stage device 14 is moved to a mask exchange position with respect to the mask loader, a scale for mask exchange may be provided at mask stage device 14 or another stage device, and the position information of mask stage device 14 may be acquired using head unit stage 54. Further, another position measurement system (e.g., marks on the stage and an observing system for observing the marks) different from the encoder system may be provided and thereby the exchange position control (management) of the stage may be performed.

Further, the illumination light may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm). Further, as the illumination light, a harmonic wave, which is obtained by amplifying a single-wavelength laser beam in the infrared or visible range emitted by, for example, a DFB semiconductor laser or a fiber laser, with a fiber amplifier doped with, for example, erbium (or both erbium and ytterbium), and by converting the wavelength into ultraviolet light using a nonlinear optical crystal, may also be used. Further, a solid laser (with a wavelength: 355 nm and 266 nm) or the like may be used.

Further, although the case has been described where projection optical system 16 is a projection optical system of a multi-lens method equipped with a plurality of optical systems, the number of the projection optical systems is not limited thereto, and one or more of the projection optical systems have only to be provided. Further, the projection optical system is not limited to the projection optical system of a multi-lens method, but may be a projection optical system using an Offner-type large mirror or the like. Further, projection optical system 16 may be a magnifying system or a reduction system.

Further, the use of the exposure apparatus is not limited to the exposure apparatus for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as, for example, a wafer, a ceramic substrate, a film member, or a mask blank. Further, in the case where an object to be exposed is a substrate for flat-panel display, the thickness of the substrate is not particularly limited, and for example, a film-like member (a sheet-like member with flexibility) is also included. Note that the exposure apparatus of the present embodiments is especially effective in the case where a substrate having a side or a diagonal line with a length of 500 mm or greater is an object to be exposed.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in the embodiments described above and a device pattern is formed on the glass substrate, and therefore, the devices with a high integration degree can be manufactured with high productivity.

Incidentally, the disclosures of all the U.S. patent application Publications and the U.S. patents related to exposure apparatuses and the like that are cited in the embodiments described above are each incorporated herein by reference.

INDUSTRIAL APPLICABILITY

As is described so far, the exposure apparatus and the exposure method of the present invention are suitable for exposing objects with illumination light. Further, the manufacturing method of flat-panel displays of the present invention is suitable for production of flat-panel displays. Further, the device manufacturing method of the present invention is suitable for production of microdevices.

REFERENCE SIGNS LIST

10 . . . liquid crystal exposure apparatus,
14 . . . mask stage device,
20 . . . substrate stage device,
24 . . . substrate holder,
40 . . . mask holder,
50 . . . mask encoder system,
54 . . . head stage,
60 . . . substrate encoder system,
64 . . . head stage,
90 . . . main controller,
M . . . mask,
P . . . substrate.

The invention claimed is:

1. An exposure apparatus that exposes an object with an illumination light via a projection optical system, the apparatus comprising:
   a frame member that supports the projection optical system;
   a first movable body that is disposed below the projection optical system, and holds the object;
   a measurement section that measures position information of the first movable body with respect to the frame member; and
   a first drive section that moves the first movable body in a first direction and a second direction based on the position information, the first direction and the second direction being orthogonal to each other within a predetermined plane orthogonal to an optical axis of the projection optical system, wherein
   the measurement section has
      a first scale having a length sufficient to measure a movable distance of the first movable body in the first direction,
      a second scale having a length sufficient to measure a movable distance of the first movable body in the second direction, and provided at the frame member,
      a first head capable of measuring a position of the first movable body with respect to the first scale in the first direction,
      a second head provided at the first scale, and capable of measuring a position of the first scale in the second direction in a state facing the second scale, and
      a second drive section that relatively moves the first scale with respect to the second scale in the second direction while maintaining a facing state between the second head and the second scale.

2. The exposure apparatus according to claim 1, further comprising:
   a second movable body provided with the first head and movable within the predetermined plane; and
   a third drive section that moves the second movable body in the first and the second directions, wherein
   the measurement section has a detecting section that detects a detected section provided at the first movable body,
   the third drive section moves the second movable body based on a detection result of the detected section by the detecting section supported by the second movable body, and
   the measurement section measures the position information of the first movable body based on the detection result.

3. The exposure apparatus according to claim 2, wherein the detected section is a third scale having a grating area, and
   the detecting section is a third head that irradiates the third scale with a measurement beam, and measurement information of the third head the measurement beam of which is irradiated on the third scale serves as the detection result.

4. The exposure apparatus according to claim 3, wherein the third scale is shorter than the first scale and the second scale.

5. The exposure apparatus according to claim 2, wherein the third drive section moves the second movable body in the first direction to follow the first movable body that is moved in the first direction by the first drive section, while keeping a facing state between the first scale and the first head and a facing state between the third scale and the third head.

6. The exposure apparatus according to claim 2, wherein the third drive section moves the second movable body in the second direction to follow the first movable body that is moved in the second direction by the first drive section, while keeping a facing state between the first scale and the first head and a facing state between the third scale and the third head, and
   the second drive section moves the second scale with respect to the first scale so that the facing state between the second head and the second scale is maintained.

7. The exposure apparatus according to claim 1, further comprising:
   a forming device having a pattern holding body that holds a predetermined pattern and a fourth drive section that drives the pattern holding body in the first direction, the forming device forming the predetermined pattern on the object via the pattern holding body using an energy beam.

8. The exposure apparatus according to claim 7, wherein the object is a substrate used in a flat-panel display.

9. The exposure apparatus according to claim 8, wherein the substrate has at least a side or a diagonal line with a length of 500 mm or greater.

10. A manufacturing method of a flat-panel display, comprising:
    exposing the object using the exposure apparatus according to claim 8; and
    developing the object that has been exposed.

11. A device manufacturing method, comprising:
    exposing the object using the exposure apparatus according to claim 7; and
    developing the object that has been exposed.

12. An exposure method of exposing an object with an illumination light via a projection optical system, the method comprising:
    measuring position information of a first movable body with respect to the projection optical system by a measurement section, the first movable body being disposed below the projection optical system and holding the object; and moving the first movable body in a first direction and a second direction based on the position information, the first direction and the second direction being orthogonal to each other within a predetermined plane orthogonal to an optical axis of the projection optical system, wherein the measurement section has
- a first scale having a length sufficient to measure a movable distance of the first movable body in the first direction,
- a second scale having a length sufficient to measure a movable distance of the first movable body in the second direction, and provided at a frame member that supports the projection optical system,
- a first head capable of measuring a position of the first movable body with respect to the first scale in the first direction,
- a second head provided at the first scale, and capable of measuring a position of the first scale in the second direction in a state facing the second scale, and
- a second drive section that relatively moves the first scale with respect to the second scale in the second direction while maintaining a facing state between the second head and the second scale.

13. The exposure method according to claim 12, further comprising:
moving a second movable body provided with the first head in the first and the second directions, wherein
in the moving the second movable body, the second movable body is moved based on a detection result of a detected section by a detecting section, the detected section being provided at the first movable body, and the detecting section being supported by the second movable body, and
in the moving the first movable body, the first movable body is moved based on the position information obtained based on the detection result.

14. The exposure method according to claim 13, wherein
in the moving the second movable body, measurement information of a third head serves as the detection result, the third head being provided at the second movable body and irradiating a third scale with a measurement beam, the third head being the detecting section and the third scale being the detected section.

* * * * *